(12) United States Patent
Bestler et al.

(10) Patent No.: US 10,928,491 B2
(45) Date of Patent: Feb. 23, 2021

(54) LASER DISTANCE MEASURING MODULE WITH INL ERROR COMPENSATION

(71) Applicant: HEXAGON TECHNOLOGY CENTER GMBH, Heerbrugg (CH)

(72) Inventors: Simon Bestler, Langenargen (DE); Rainer Wohlgenannt, Klaus (AT); Jürg Hinderling, Marbach (CH)

(73) Assignee: HEXAGON TECHNOLOGY CENTER GMBH, Heerbrugg (CH)

( * ) Notice: Subject to any disclaimer, the term of this patent is extended or adjusted under 35 U.S.C. 154(b) by 505 days.

(21) Appl. No.: 15/835,014

(22) Filed: Dec. 7, 2017

(65) Prior Publication Data
US 2018/0172805 A1 Jun. 21, 2018

(30) Foreign Application Priority Data
Dec. 21, 2016 (EP) .................................... 16205847

(51) Int. Cl.
| | |
|---|---|
| *G01S 7/4861* | (2020.01) |
| *G01S 7/497* | (2006.01) |
| *G01S 17/10* | (2020.01) |
| *H03M 1/14* | (2006.01) |
| *H03M 1/10* | (2006.01) |
| *H03M 1/06* | (2006.01) |
| *H03M 1/12* | (2006.01) |

(52) U.S. Cl.
CPC ............ *G01S 7/4861* (2013.01); *G01S 7/497* (2013.01); *G01S 17/10* (2013.01); *H03M 1/0641* (2013.01); *H03M 1/1033* (2013.01); *H03M 1/1042* (2013.01); *H03M 1/14* (2013.01); *H03M 1/121* (2013.01)

(58) Field of Classification Search
None
See application file for complete search history.

(56) References Cited

U.S. PATENT DOCUMENTS

| | | | |
|---|---|---|---|
| 6,509,958 B2 | 1/2003 | Pierenkemper | |
| 9,347,773 B2 * | 5/2016 | Stutz | ...................... G01S 17/36 |
| 2002/0018198 A1 * | 2/2002 | Pierenkemper | ....... G01S 7/4817 356/4.01 |

(Continued)

FOREIGN PATENT DOCUMENTS

| | | |
|---|---|---|
| EP | 1 160 585 A2 | 12/2001 |
| EP | 1 832 897 B1 | 11/2010 |

OTHER PUBLICATIONS

EP Partial Search Report dated Nov. 16, 2017 as received in Application No. 16205847.3.

(Continued)

*Primary Examiner* — Yuqing Xiao
*Assistant Examiner* — Amir J Askarian
(74) *Attorney, Agent, or Firm* — Maschoff Brennan (57) ABSTRACT

A distance measuring method and an electronic laser distance measuring module, in particular for use in a distance measuring apparatus, especially configured as a laser tracker, tachymeter, laser scanner, or profiler, for fast signal detection with an analog-to-digital converter, wherein conversion errors that arise in the context of a signal digitization, in particular timing, gain and offset errors of the ADC, are compensated for by means of variation of the sampling instants.

10 Claims, 5 Drawing Sheets

(56) References Cited

U.S. PATENT DOCUMENTS

| | | | | |
|---|---|---|---|---|
| 2002/0195208 | A1* | 12/2002 | Johnson | G02F 3/024 |
| | | | | 160/1 |
| 2009/0195770 | A1* | 8/2009 | Satzky | G01S 7/497 |
| | | | | 356/5.01 |
| 2010/0103003 | A1* | 4/2010 | Deval | H03M 3/33 |
| | | | | 341/118 |
| 2010/0277714 | A1* | 11/2010 | Pedersen | G01S 7/497 |
| | | | | 356/28 |
| 2011/0098970 | A1* | 4/2011 | Hug | G01S 13/103 |
| | | | | 702/159 |
| 2012/0213531 | A1* | 8/2012 | Nazarathy | H03M 3/434 |
| | | | | 398/202 |
| 2014/0368364 | A1* | 12/2014 | Hsu | H03M 1/0624 |
| | | | | 341/118 |
| 2016/0003946 | A1* | 1/2016 | Gilliland | G01S 17/87 |
| | | | | 356/5.01 |
| 2017/0104544 | A1* | 4/2017 | Chung | H04B 10/588 |
| 2018/0136330 | A1* | 5/2018 | Nihei | G01S 7/4865 |

OTHER PUBLICATIONS

Malkiewicz, "Improvement of intelligent cyclic ADC resolution by randomization of DAC INL errors," Proceedings of the SPIE 8454, Photonics Applications in Astronomy, Communications, Industry, and High-Energy Physics Experiments 2012, Oct. 15, 2012, pp. 9.

\* cited by examiner

LASER DISTANCE MEASURING MODULE WITH INL ERROR COMPENSATION

CROSS-REFERENCE TO RELATED APPLICATIONS

This application claims priority to European Patent Application No. 16205847, filed on Dec. 21, 2016. The foregoing patent application are incorporated herein by reference.

FIELD OF THE INVENTION

The present invention relates to a distance measuring method and an electronic laser distance measuring module, in particular for use in a distance measuring apparatus, e.g. in a laser tracker, tachymeter, laser scanner, or profiler, for fast signal detection with an analog-to-digital converter, wherein a compensation of the integral nonlinearity of the analog-to-digital converter is carried out.

BACKGROUND

Various principles and methods are known in the field of electronic and electro-optical distance measurement. One approach consists in emitting pulsed electromagnetic radiation, such as e.g. laser light, onto a target to be measured and in subsequently receiving an echo from said target as a backscattering object, wherein the distance to the target to be measured can be determined for example on the basis of the time of flight, the shape, and/or the phase of the pulse. Such laser distance measuring devices have gained acceptance in the meantime as standard solutions in many fields.

Two different approaches or a combination thereof are usually used for detecting the backscattered pulse.

The so-called threshold value method involves detecting a light pulse if the intensity of the radiation incident on a detector of the distance measuring apparatus used exceeds a certain threshold value. Said threshold value prevents noise and interference signals from the background from being erroneously detected as a useful signal, i.e. as backscattered light of the emitted pulse.

The other approach is based on the sampling of the backscattered pulse. This approach is typically used in the case of weak backscattered signals (e.g. pulse signals), such as are caused for example by relatively large measurement distances, or generally for increasing the measurement accuracy. An emitted signal is detected by virtue of the fact that the radiation detected by a detector is sampled, a signal is identified within the sampled region and, finally, a position of the signal is determined temporally. By using a multiplicity of samples and/or summation of the reception signal synchronously with the emission rate, it is possible to identify a useful signal even under unfavorable circumstances, such that it is possible to cope with even relatively large distances or background scenarios that are noisy or beset by disturbances.

Nowadays, the entire waveform of the analog signal of the radiation detected by a detector is often sampled here by means of the waveform digitizing (WFD) method. After identification of the coding of the associated transmission signal (ASK, FSK, PSK, etc.) of a received signal, a signal time of flight ("pulse time of flight") is determined very accurately from a defined profile point of the sampled, digitized and reconstructed signal, for example the points of inflection, the curve maxima, or integrally by means of an optimum filter known from the time interpolation.

As an alternative or in addition to determining the pulse time of flight, a (fast) sampling is often also effected with regard to pulses or pulse sequences coded or modulated in terms of amplitude, phase, polarization, wavelength and/or frequency.

In the approach of temporally very precise sampling of the backscattered signal, the electrical signal generated by the detector is converted into a digital signal sequence by means of an analog-to-digital converter (ADC). Said digital signal is then usually processed further in real time. In a first step, the signal, often modulated as a pulse, is identified by specific digital filters and, finally, its position within the signal sequence is determined. By using a multiplicity of sampled pulse sequences, it is possible to identify a useful signal even under unfavorable circumstances, such that it is possible to cope with even relatively large distances or background scenarios that are noisy or beset by disturbances.

One of the simplest types of modulation is the identification of the individual pulses or pulse sequences by distance coding, as described e.g. in EP 1 832 897 B1. This is used for example for the purpose of re-identifiability. This re-identification is necessary if an ambiguity arises, which may be brought about by various situations during the time-of-flight measurement of pulses, for example if more than one pulse or a pulse group is situated between measuring apparatus and target object.

In fast analog-to-digital converters (ADC), the high sampling rate in conjunction with a high resolution of the signal amplitude (e.g. 1 GS/s, 14-bit) is achieved for example by the generation of a plurality of ADC conversion stages, for example by:

temporally interleaving ("interleave") a plurality of slow ADC cores, quantizing the sampled signal amplitudes in stages ("pipeline"), or in combination multi-stage quantization of the signal samples of a plurality of ADC cores.

In the case of these architectures, architecture-typical errors arise despite careful internal corrections. Said errors vary over time and temperature.

In the case of interleaved ADCs, the typical errors are manifested in particular as:

skew (timing error between the sample instants of the different ADC cores or ADCs);

gain (different gain factor between the internal ADC core components. The signal is usually amplified and/or buffered in the ADC);

offset (different DC levels of the internal outputs of the ADC cores).

Particularly in the case of pipelined ADCs, the typical errors are usually manifested as differential nonlinearity DNL and integral nonlinearity INL. DNL and INL are errors during the conversion of the analog signal values into digital (integral) values, for example brought about by the quantization in stages in a pipeline ADC with steps becoming finer and finer/resolution becoming higher and higher.

The INL error is essentially the partial sum of all the contributions of the DNL errors below the signal level to be converted and can attain a plurality of LSBs ("Least Significant Bits"). Therefore, even in the case of moderate fluctuations of the signal values, the INL error, in particular, has serious effects on the digitized signal waveform accuracy. The digitized signal waveform no longer corresponds to the original analog signal waveform. By means of internal corrections in the ADC component, these DNL and INL errors can be partly minimized, but not eliminated, and an external calibration, which may be realized by measuring and recording the residual error, is variable over time and for example highly temperature-dependent.

During the distance measurement, over distance periodic distance errors in the distance of the sampling/sample pattern arise as a result of the INL errors. Furthermore, an INL error generates a distance error dependent on the reception signal value. The edges of a digital signal pulse are corrupted by the quantization errors in the excursion, as a result of which the position of the signal pulse can be shifted with respect to the time axis. Errors in the measurement distance can occur even in distance measuring systems having start and stop pulses or start and stop signal sequences. By way of example, this is the case if the start pulse has an amplitude in the medium modulation range, whereas the stop pulse has an amplitude in the lower amplitude range, wherein as a result of an INL-dictated shape distortion, both pulses are deformed differently and the absolute distance is corrupted.

SUMMARY

Therefore, one object of some embodiments of the invention is to provide an improved distance measurement with at the same time a high measurement accuracy and a high distance resolution.

In this case, one specific object of some embodiments of the invention is to provide an improved method and an improved system for signal digitization.

A further specific object of some embodiments of the invention, moreover, is to provide an improved compensation of the INL error during the signal digitization.

These objects are achieved by the realization of the characterizing features of the independent claims. Features that develop the invention in an alternative or advantageous way can be gathered from the dependent patent claims.

Some embodiments of the invention relate to a distance measuring method, in particular for a laser distance measuring apparatus, especially configured as a laser tracker, tachymeter, laser scanner, or profiler, for determining a distance to a target object comprising emitting transmission signals, in particular pulsed transmission signals, as a transmission signal series; receiving at least portions of the transmission signals of the transmission signal series reflected at the target object as reception signals of a reception signal series; digitizing the reception signals of the reception signal series into digital signals of a digital signal series by means of an analog-to-digital converter, referred to hereinafter as ADC, in particular of the interleave ADC or pipeline ADC type; and processing the digital signal series, in particular summing or averaging the digital signals over the digital signal series, in order to derive the distance to the target object therefrom; in particular wherein the determination of the distance is based on the pulse time-of-flight method.

According to the present invention, the reception signal series is superimposed with a bias signal that varies in a defined manner, wherein the value of the bias signal is varied over time in such a way that reception signals of the reception signal series are superimposed with different offset values within a defined value range, in particular wherein the bias signal is average-value-free over the time period occupied by the reception signal series.

The linear portion of the global profile of an error on account of an integral nonlinearity of the ADC, referred to hereinafter as INL error, depending on the signal value of an ADC input signal (INL trend profile, e.g. typically an "S-shape", see FIG. 4) generates essentially only a signal amplification error and has no influence on the distance measurement accuracy. By contrast, the INL error can vary locally with the ADC sampling sequence to a very great extent, thus giving rise to a distance measurement error which is for example singly periodic or multiply periodic with the ADC sampling sequence.

As a result of the varying value of the bias signal, the actual ADC measurement signal and thus individual reception signals are shifted over a wide value range, as a result of which various (local) error zones of the INL error are swept over. The processing of a plurality of reception signals (e.g. individual pulse signals, "single shots"), for example an averaging or a summation, thus automatically gives rise to an averaging over different INL error contributions, thereby minimizing the (local) INL error in the processed digitized signal.

In the specific case wherein the bias signal is average-value-free over the time period occupied by the reception signal series, the local INL error is minimized since both the start pulse and the stop pulse are detected and averaged over significant local INL-dictated shape distortions. The error of the absolute distance ultimately measured is thereby minimized. In the case of a general, non-average-value-free, variable bias signal, by contrast, a substantially constant offset is introduced along the amplitude direction of an INL error curve (see FIG. 5), but can be taken into account in the context of the calibration of the global INL error.

In particular, in one specific embodiment, the different offset values are taken into account during the processing of the digital signal series in order to compensate for an average integral nonlinearity of the ADC as a function of a signal value of an ADC input signal.

Specifically, the bias signal is configured as a signal having a low-frequency oscillation component (for example having a frequency of <1 MHz), in particular a sinusoidal signal, a sawtooth signal, a staircase signal, a triangular signal, or a trapezoidal signal.

In a further embodiment, the bias signal is generated by means of at least one of the following measures: adding different discrete DC values to an ADC input signal of an ADC input signal series generated by the reception signal series at different instants of the ADC input signal series, in particular set by a digital-to-analog converter, referred to hereinafter as DAC; periodically shifting the offset levels of the common-mode voltage of the ADC; and a noise generator for generating a variable additional signal to the ADC input signal series, in particular by making use of the thermal noise of resistors, diodes or the like or by superimposing a pseudo-random sequence generated by feedback shift registers.

The average (local) INL error can vary for example as a function of an average signal value over different value ranges, e.g. in the sense that the (local) INL error is larger for example for a range having a relatively high average signal value than for a range having a relatively low average signal value. Furthermore, the minimization of the local INL error, that is to say also the distance measurement accuracy achieved, is crucially dependent on the value range over which the actual measurement signal is varied (and thus averaged).

One specific embodiment relates to a setting of the value range of the bias signal, in particular by means of an FPGA or a microprocessor, on the basis of a defined measurement accuracy for the determination of the distance, and/or a measured value of a reception signal.

Some embodiments of the invention furthermore relate to a distance measuring method, in particular for a laser distance measuring apparatus, especially configured as a laser tracker, tachymeter, laser scanner, or profiler, for determining a distance to a target object in the context of a measurement campaign comprising emitting a transmission signal, in particular a pulsed transmission signal; receiving at least portions of the transmission signal reflected at the target object as a reception signal; and processing the reception signal into a digital signal by means of an analog-to-digital converter, referred to hereinafter as ADC, in particular of the interleave ADC or pipeline ADC type, in order to derive the distance to the target object therefrom; in particular wherein the determination of the distance is based on the pulse time-of-flight method.

In this case, in the context of the measurement campaign determining parameters of an integral nonlinearity of the ADC as a function of a signal value of an ADC input signal is carried out, referred to hereinafter as INL parameters; wherein the INL parameters are used in the context of processing the reception signal, in particular wherein the INL parameters are taken into account in real time, especially by means of an FPGA or microcontroller using a look-up table for the INL parameters; wherein in the context of determining the INL parameters at least one stability criterion for the INL parameters is taken into account as a function of a measurement instant of the measurement campaign, in particular on the basis of a temperature of the distance measuring apparatus.

By way of example, before each measurement campaign, consisting of a single or a plurality of distance measurements, it is possible to determine in each case current INL parameters for a current INL error contribution, for example depending on a system temperature of the distance measuring apparatus, or it is possible to use INL parameters determined in the context of a previous distance measurement within a defined time period between a plurality of distance measurements—depending on a known temporal stability of the INL error contribution.

By way of example, such a calibration process can be integrally contained in the distance measuring unit, wherein determining the INL parameters is carried out by digitizing a calibration series of calibration signals having a known signal characteristic, in particular a known signal waveform, by means of the ADC, wherein a deviation of the digitized calibration series from an expected ideal calibration series is determined on the basis of the known signal characteristic of the calibration signals.

By way of example, the calibration series can be given by at least one element of the following group: a series of sinusoidal signals; a series of pulse sequences having different signal values from the lowest to the maximum LSB signal level of the ADC; and a series of statistically randomly composed signals, wherein from the randomly composed signals at least the statistical signal value distribution thereof (the spectral composition or amplitude distribution thereof) is known, in particular white noise whose value range comprises the entire value range of the ADC.

By way of example, the deviation of the real digitized output values with respect to the ideal input values can be plotted against the input voltage axis, as a result of which the INL of the sampling unit is known as a function of the signal value of the signal waveform used.

In a distance measurement, it is then possible to eliminate the influence of the INL error on the basis of the INL error curve then known by computationally correcting the raw values of the sampled and quantized shape of the reception signal by means of the values from the INL error curve. In this case, each digital sample is corrected by the associated value from the INL curve, the easiest way being in real time in an FPGA, and this results in an error-free signal waveform free of distortion as a result of the INL. The distance measurement accuracy becomes very accurate as a result; the subsampling interpolation accuracy of the time axis can exceed the value of 10 000.

Alternatively, the transmission signals can be emitted toward a target object with constant distance to the distance measuring apparatus, wherein determining the INL parameters is carried out by means of at least one of the following measures: that the signal values of the emitted transmission signals are varied, in particular continuously varied; and that the signal values of the emitted transmission signals are stabilized over a defined calibration period and the stabilized transmission signals are sampled with a multiplicity of different, in particular continuously varying, sampling instants.

By way of example, the laser distance measuring apparatus can be aligned with a target object and fixed for the calibration process, wherein for example the emitted signal value is continuously increased for the calibration process, and as a result a current INL error curve is determined as a function of the (known) emitted signal value.

In a further exemplary calibration process, the distance to a known target and the signal value of a calibration transmission signal that is emitted toward said target are kept constant, wherein the signal waveform (substantially known for the calibration process) of the calibration transmission signal is sampled with a multiplicity of different sampling points and as a result once again a current INL error curve is determined as a function of the (known) signal value at the respectively sampled signal positions. In order that the entire value range of the INL curve is covered, care should be taken in particular to ensure that the reception signal modulates the ADC as far as possible fully up to the maximum value.

For the calibration process, in particular a calibration target object provided specifically for the calibration process can be fitted on or in the distance measuring apparatus. A shielded internal calibration, i.e. an internally fitted calibration target object with a shielding of the calibration transmission signal used from the outside, here has at most the advantage that higher laser energies can be used and for example possible stipulations regarding eye safety are obviated as a result.

Alternatively, an integral nonlinearity of the ADC can be at least partly compensated for by a multiplicity of samplings of individual (identical) reception signals at different signal positions with a varying signal strength of the respectively digitized signal value, as a result of which the actual ADC measurement signal is shifted around the respective digitized signal value over a value range and various signal-value-dependent error zones of an ADC conversion error are swept over as a result. This compensation method is described for example in the European patent application "Laser Distance Measuring Module with ADC Error Compensation by Variation of the Sampling Instants" application Ser. No. 16206010.7, filed Dec. 21, 2016.

Directly after a recording of a reception signal has started, the ADC constantly supplies digital values each having a temporal spacing of a clock period, and this hardware-dictated ADC sampling pattern defines an initial signal sampling pattern of a reception signal. The transmission signal is repeated a number of times or repetitively, this transmission signal series is sampled in a temporally continuously shifted manner and secondary signal sampling patterns arise. This plurality of secondary digital reception signals exhibit different relative temporal positions within the ADC clock interval. If the quotient between the temporal shift and the clock interval is a rational number, then the oversampling is repeated after a defined time and comprises a defined number of reception signals sampled with an identical phase. This has the advantage that these signals of identical type can be jointly processed, for example accumulated, and can then be treated as a single finely sampled reception signal in the evaluation. In this case, the errors resulting from ADC conversion errors largely cancel one another out, wherein it is crucial, in particular, to consider the relative temporal shift of the transmission pulse with respect to the sampling pattern in the context of the number of ADC conversion stages, for example in the sense that identical sampling points of the transmission pulses are detected by a plurality of ADC conversion stages.

An alternative evaluation method is processing, in particular accumulation, on the basis of all the initial and secondary digital signal sequences in such a way that the corresponding samples of all the secondary digital signals which are shifted by less than plus/minus half a clock interval with respect to the samples of the initial digital signal are processed (e.g. accumulated) and as a result an averaging is effected, for example, which greatly reduces the error influences of the ADC or of individual ADC conversion stages. This evaluation method is also expedient if the quotient between the temporal shift and the clock interval is an irrational number. This evaluation method therefore functions for all settings of the asynchronism between the clock of the transmitting unit and the clock of the receiving electronics.

A further specific embodiment is accordingly characterized in that the ADC generates an ADC sampling pattern by means of at least two ADC conversion stages, wherein the ADC sampling pattern defines with respect to a reception signal an initial signal sampling pattern with at least one initial sampling point of the reception signal (wherein the clock period of the initial signal sampling pattern is typically given by a hardware-dictated working cycle of the ADC conversion stages), and the reception signals of the reception signal series are temporally shifted relative to the ADC sampling pattern by means of a first temporal shift in such a way that the at least one initial sampling point is detected at least once by a first ADC conversion stage and at least once by a second ADC conversion stage; in particular wherein the reception signals of the reception signal series are additionally temporally shifted relative to the ADC sampling pattern by means of a second temporal shift such that in a defined sampling range around the at least one initial sampling point a multiplicity of secondary sampling points of the reception signals arise, said secondary sampling points being shifted in each case by a fraction of the period duration (clock interval) of the ADC clock signal, and this results in the sampling of different signal positions around the at least one initial sampling point with a varying signal value.

ADC conversion errors, for example timing, gain, offset or INL errors, can vary very greatly locally with the ADC sampling sequence, thereby giving rise to a distance measurement error that is periodic with the ADC sampling sequence.

As a result of the multiplicity of samplings of different signal positions with a varying amplitude (signal strength) of the respectively digitized signal value, the actual ADC measurement signal is shifted around the at least one initial sampling point over a range of values, as a result of which different signal-value-dependent error zones of an ADC conversion error are swept over. As a result of the processing of a plurality of reception signals, for example an averaging or a summation, and thus of a multiplicity of secondary samplings around the initial sampling point, an averaging over different error contributions of ADC conversion errors thus automatically arises.

As a result of the sampling of the at least one initial sampling point and, if appropriate, the secondary samplings (secondary sampling points) by a plurality of ADC conversion stages ("mixing of the ADC conversion stages") there is mixing of the error contributions of the ADC conversion stages for example in the sampling range around the initial sampling point, as a result of which a sufficient error cancellation is already ensured after a small number of signal pulses and after a short measurement time.

In one specific embodiment, the transmission signals are emitted on the basis of a transmission clock (having a fixed transmission clock frequency) and the reception signals are detected on the basis of an ADC clock, wherein at least one of the following conditions is met in the context of a measuring process: the transmission clock is asynchronous with respect to the ADC clock; the period duration of the transmission clock and/or a period duration of the transmission signals are/is different than the period duration of the ADC clock signal or than an integral multiple of the period duration of the ADC clock signal; and the transmission period $T_s$ ($=1/f_s$) corresponding to the transmission clock frequency and/or to a repetition rate of the transmission signals $f_s$ is given as $T_s=(n+q)*T_{ADC}$, wherein n is an integer, q is a fractional number having an absolute value of <1, and $T_{ADC}$ is the period duration of the ADC clock signal (the ADC sampling period corresponding to the ADC clock frequency $f_{ADC}$, $T_{ADC}=1/f_{ADC}$), wherein for a number of ADC conversion stages c used the condition n modulo c≠0 is met.

As described above, a compensation of the errors resulting from ADC conversion errors is crucially dependent on identical sampling points of the transmission pulses being detected—at best a number of times—by a plurality of ADC conversion stages, as a result of which the ADC conversion errors largely cancel one another out. In particular, it is thus crucial to consider the relative temporal shift of the transmission pulse with respect to the sampling pattern in the context of the number of ADC conversion stages.

Some embodiments of the invention furthermore relate to an electronic laser distance measuring module, in particular for use in a distance measuring apparatus, especially configured as a laser tracker, tachymeter, laser scanner, or profiler, for determining a distance to a target object comprising a transmission channel having a transmitting unit for generating optical transmission signals of a transmission signal series, in particular by means of pulsed laser measurement radiation; a reception channel having a receiving unit for receiving at least portions of the transmission signals of the transmission signal series reflected at the target object as reception signals of a reception signal series; a reception circuit for digitizing the reception signals of the reception signal series into digital signals of a digital signal series with an analog-to-digital converter, referred to as ADC hereinafter, in particular of the interleave ADC or pipeline ADC type; and a supervisory and control unit for determining the distance to the target object on the basis of a processing of the digital signal series, in particular summing or averaging the digital signals over the digital signal series; in particular wherein the determination of the distance is based on the pulse time-of-flight method.

In this case, according to some embodiments of the present invention, the laser distance measuring module is adapted in such a way that a bias signal that varies in a defined manner is generated, and the reception signal series is superimposed with the bias signal, wherein the value of the bias signal is varied over time in such a way that reception signals of the reception signal series are superimposed with different offset values within a defined value range, in particular wherein the bias signal is average-value-free over the time period occupied by the reception signal series.

In one specific embodiment, the laser distance measuring module is configured in such a way that the different offset values are taken into account during the processing of the digital signal series by the supervisory and control unit in order to compensate for an average integral non-linearity of the ADC as a function of a signal value of an ADC input signal.

In a further embodiment of the laser distance measuring module according to the invention, the bias signal is configured as a signal having a low-frequency oscillation component (e.g. having an oscillation frequency of <1 MHz), in particular a sinusoidal signal, a sawtooth signal, a staircase signal, a triangular signal, or a trapezoidal signal.

In this case, by way of example, the bias signal can be generated by means of at least one of the following measures: adding different discrete DC values to an ADC input signal of an ADC input signal series generated by the reception signal series at different instants of the ADC input signal series, in particular set by a digital-to-analog converter, referred to hereinafter as DAC; periodically shifting the offset levels of the common-mode voltage of the ADC; and a noise generator for generating a variable additional signal to the ADC input signal series, in particular by making use of the thermal noise of resistors, diodes or the like or by superimposing a pseudo-random sequence generated by feedback shift registers.

In one advantageous embodiment, the laser distance measuring module according to the invention is adapted in such a way that the value range of the bias signal is set, in particular by means of an FPGA or a microprocessor, on the basis of a defined measurement accuracy for the determination of the distance, and/or a measured value of a reception signal.

Some embodiments of the invention furthermore relate to an electronic laser distance measuring module, in particular for use in a distance measuring apparatus, especially configured as a laser tracker, tachymeter, laser scanner, or profiler, for determining a distance to a target object in the context of a measurement campaign, comprising a transmission channel having a transmitting unit for generating a transmission signal, in particular by means of pulsed laser measurement radiation; a reception channel having a receiving unit for receiving at least one portion of the transmission signal reflected at the target object as a reception signal; a reception circuit for processing the reception signal into a digital signal with an analog-to-digital converter, referred to as ADC hereinafter, in particular of the interleave ADC or pipeline ADC type; and a supervisory and control unit for deriving the distance to the target object on the basis of the digital signal, in particular wherein the determination of the distance is based on the pulse time-of-flight method.

According to some embodiments of the present invention, the laser distance measuring module is adapted here in such a way that in the context of the measurement campaign a calibration process is provided for determining parameters of an integral nonlinearity of the ADC as a function of a signal value of an ADC input signal, referred to hereinafter as INL parameters, and the INL parameters are used in the context of processing the reception signal, in particular wherein the INL parameters are taken into account in real time, especially by means of an FPGA or microcontroller using a look-up table for the INL parameters, wherein in the context of the calibration process at least one stability criterion for the INL parameters is taken into account as a function of a measurement instant of the measurement campaign, in particular on the basis of a temperature of the distance measuring apparatus.

In one specific embodiment, the laser distance measuring module is adapted in such a way that determining the INL parameters is carried out by digitizing a calibration series of calibration signals having a known signal characteristic, in particular a known signal waveform, by means of the ADC, wherein a deviation of the digitized calibration series from an expected ideal calibration series is determined on the basis of the known signal characteristic of the calibration signals.

In this case the calibration series can be given for example by at least one element of the following group: a series of sinusoidal signals; a series of pulse sequences having different signal values from the lowest to the maximum LSB voltage level of the ADC; and a series of statistically randomly composed signals, wherein from the randomly composed signals at least the statistical signal value distribution thereof (the spectral composition or amplitude distribution thereof) is known, in particular white noise whose value range comprises the entire value range of the ADC.

A further embodiment relates to a laser distance measuring module which is adapted in such a way that the transmission signals are emitted toward a target object with constant distance to the distance measuring apparatus, wherein determining the INL parameters is carried out by means of at least one of the following measures: that the signal values of the emitted transmission signals are varied, in particular continuously varied; and that the signal values of the emitted transmission signals are stabilized over a defined calibration period and the stabilized transmission signals are sampled with a multiplicity of different, in particular continuously varying, sampling instants.

The distance measuring method according to some embodiments of the invention and the laser distance measuring module according to the invention are described in greater detail purely by way of example below on the basis of exemplary embodiments that are illustrated schematically in the drawings. In the figures, identical elements are identified by identical reference signs. The embodiments described are generally not illustrated as true to scale, nor should they be understood as a restriction.

BRIEF SUMMARY OF THE DRAWINGS

Specifically.

DETAILED DESCRIPTION

Figure 1A:
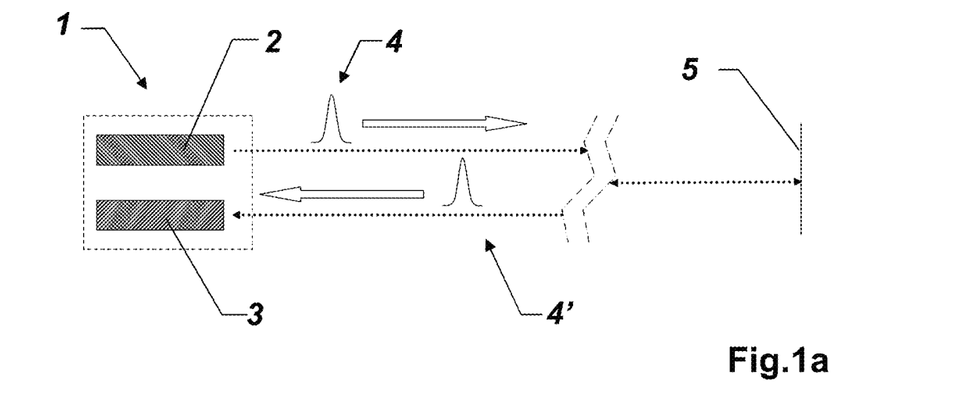
FIGS. 1a, b: show a schematic illustration of the pulse time-of-flight method in an electro-optical distance measuring apparatus according to the prior art.
Figure 1B:
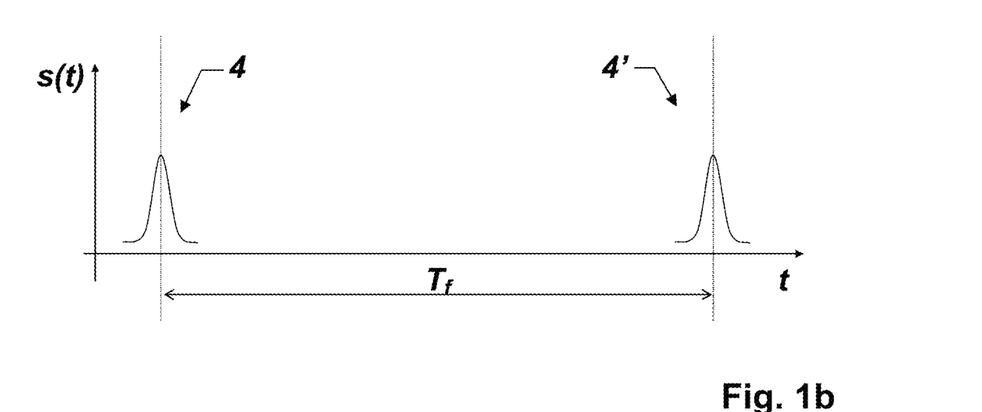

FIGS. 1a and 1b illustrate the pulse time-of-flight principle such as is used in typical electro-optical distance measuring apparatuses according to the prior art.

FIG. 1a shows a basic illustration of an electro-optical distance measuring device 1 from the prior art according to the pulse time-of-flight principle. A transmitter 2 and a receiver 3 are arranged in the distance measuring device 1. The transmitter 2 emits a light pulse 4, which, after reflection or backscattering at a target, e.g. a cooperative target object such as a retroflector 5 or an uncooperative target object such as a natural surface, is detected again as a backscattered light pulse 4' by the receiver 3. A continuously modulated transmission signal is often also used instead of the light pulses.

As elucidated schematically in FIG. 1b, the distance is ascertained from the time of flight $T_f$ as a temporal difference between the start instant of the emission of a light pulse 4 and the reception instant of the backscattered light pulse 4'. In this case, the reception instant is ascertained by the evaluation of a feature of the signal pulse s(t), e.g. by a signal threshold being exceeded or—as in the present invention—by the sampling of the signal pulse, wherein after identification of the coding of the associated transmission signal of a received signal, a pulse time of flight is determined very accurately from a defined profile point of the sampled and digitized signal, for example the points of inflection, the curve maxima, or integrally by means of an optimum filter known from the time interpolation. A further method for determining a defined profile point e.g. also comprises converting the reception signal into a bipolar signal and subsequently determining the zero crossing.

In the approach of temporally precise sampling of the backscattered pulse, the electrical signal generated by the detector is converted into a digital signal sequence by means of an analog-to-digital converter (ADC), said digital signal sequence then usually being processed further in real time. By using a multiplicity of sample sequences and/or summation of the reception signal synchronously with the emission rate, it is possible to identify a useful signal even under unfavorable circumstances, such that it is possible to cope with even relatively large distances or background scenarios that are noisy or beset by disturbances.

In fast analog-to-digital converters (ADC), the high sampling rate in conjunction with a high resolution of the signal value is achieved for example by temporally interleaving ("interleave") a plurality of slow ADCs and/or by quantizing in stages ("pipeline"). In this case, architecture-typical errors arise despite careful internal corrections, which errors vary over time and for example temperature.

Particularly in the case of pipeline ADCs, the typical errors are usually manifested as differential nonlinearity DNL and integral nonlinearity INL. DNL and INL are errors during the conversion of the analog signal value into digital (integral) values, for example brought about by the quantization in stages in a pipeline ADC with steps becoming finer and finer/resolution becoming higher and higher.

Figure 2A:
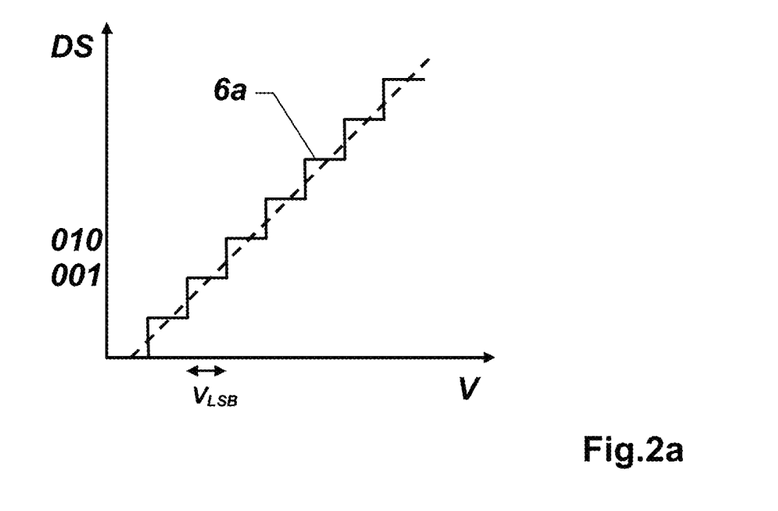
FIGS. 2a, b: show a basic illustration of a digitization by an analog-to-digital converter (ADC) with a linear relationship between the ADC input signal and the digitized output values (a) and with a differential nonlinearity (b)
Figure 2B:
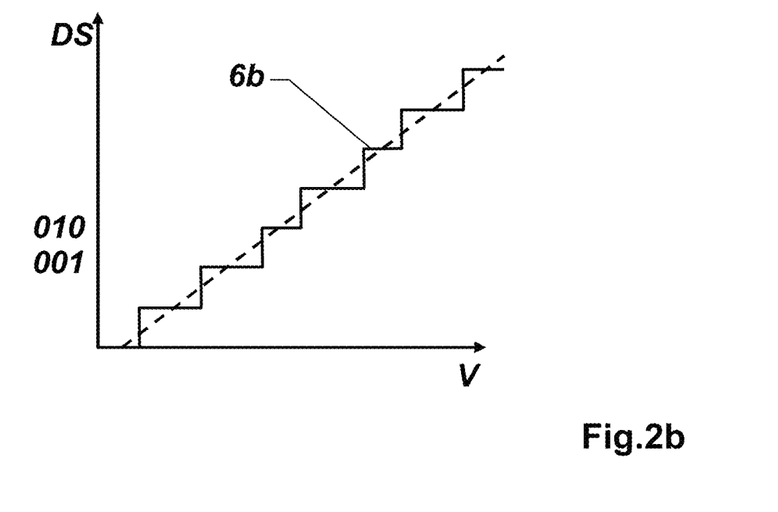

FIGS. 2a and 2b illustrate the effect of a differential nonlinearity DNL during a digitization by an analog-to-digital converter (ADC). The figures in each case show a plot for the generated digital signal DS as a function of the voltage V of an analog ADC input signal.

FIG. 2a illustrates the ideal case, wherein the digitization is effected in such a way that the difference between the threshold voltage and the next digital value is constant, that is to say that a linear digitization with a digitization step function 6a is generated, the step width $V_{LSB}$ of which is constant. In each case two neighboring digital values, e.g. the digital values 001 and 010, thus correspond to two converted analog input voltages with a separation between them of exactly one setpoint voltage $V_{LSB}$ ("Least Significant Bit").

In contrast thereto, FIG. 2b shows the effect of a differential nonlinearity DNL, wherein now in each case neighboring digital values, for example the digital values 001 and 010, correspond to analog input voltages which have a voltage difference that is less or greater than the setpoint voltage $V_{LSB}$. This produces a nonlinear digitization with a digitization step function 6b having a varying step width.

The INL error is essentially the sum of all the DNL errors cumulated up to the voltage value V of the input signal and can attain a plurality of LSBs. Therefore, even in the case of moderate fluctuations of the signal value, the INL error, in particular, has serious effects on the digitized signal waveform accuracy and as a result of the INL error over distance a singly periodic distance error in the distance of the sampling pattern arises during the distance measurement, for example.

Figure 3:
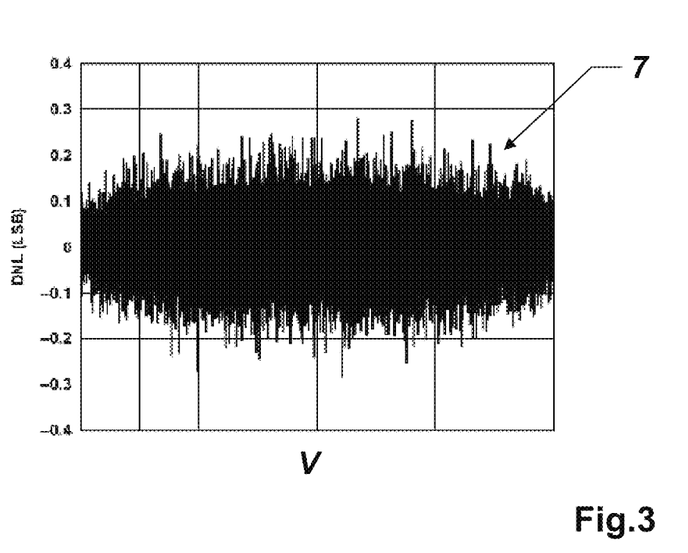
FIG. 3: shows a typical error curve for a differential nonlinearity of an ADC.

FIG. 3 shows a typical error curve 7 for a differential nonlinearity DNL, for example of an individual ADC of an interleave ADC architecture or of a quantization stage of a pipeline ADC. The DNL error curve 7 shows the deviation of neighboring digitized values from the ideal setpoint value of a respective LSB stage ("Least Significant Bit") as a function of the input voltage V.

Figure 4:
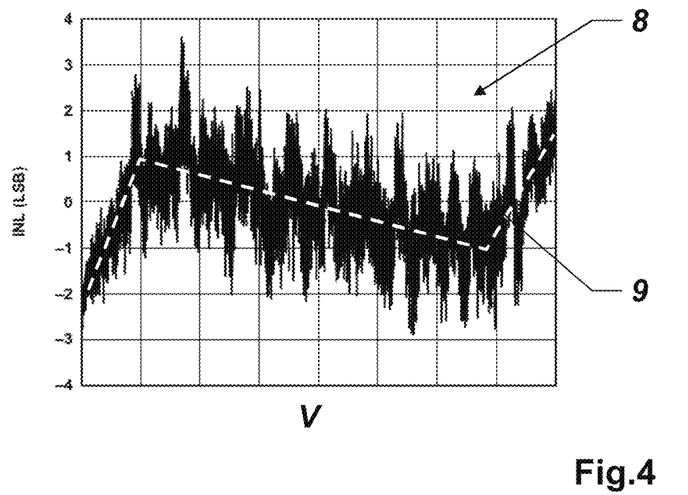
FIG. 4: shows a typical error curve for an integral nonlinearity of a fast ADC.

FIG. 4 shows a typical error curve 8 for an integral nonlinearity INL, for example of a fast interleave ADC architecture or of a pipeline ADC. The INL error curve 8 shows the deviation of the digitized value from the ideal setpoint value expressed in LSB units as a function of the ADC input voltage V.

The global profile of the INL error curve 8 (typically an S-shape) is represented here by a zigzag line 9 having three different gradients, for the sake of simplicity. If the sampled voltage values of a reception signal remain within an INL range having a substantially linear gradient value, then this generates an amplitude-dependent signal gain, which leads to a distortion of the pulse shape and reduces the distance measurement accuracy. If the sampled signal waveform comprises relatively great deviations from an average, linear gradient range of the INL curve (the signal waveform comprises e.g. a "kink" of the zigzag line 9), then further distortions arise on the signal waveform and the accuracy of a distance measurement exhibits cyclic errors with respect to the sampling pattern. The same considerations are also applicable to the start pulse. The minimum excursion of the varying bias signal should therefore be chosen to be sufficiently large, such that for example the samples assigned to the start and stop pulses on average sweep over a respective linear gradient range of the INL curve.

A local curvature of the INL error curve 8 (the local excursions/deviations of the INL error curve 8 from the global profile 9) generates a distance measurement error which for example is at least singly periodic with respect to the sampling pattern. Said local excursions of the INL curve 5 considerably influence the distance measurement accuracy. The local curvature of the INL error curve and the distance measurement error that arises as a result are corrected by the features of the present invention.

Figure 5:
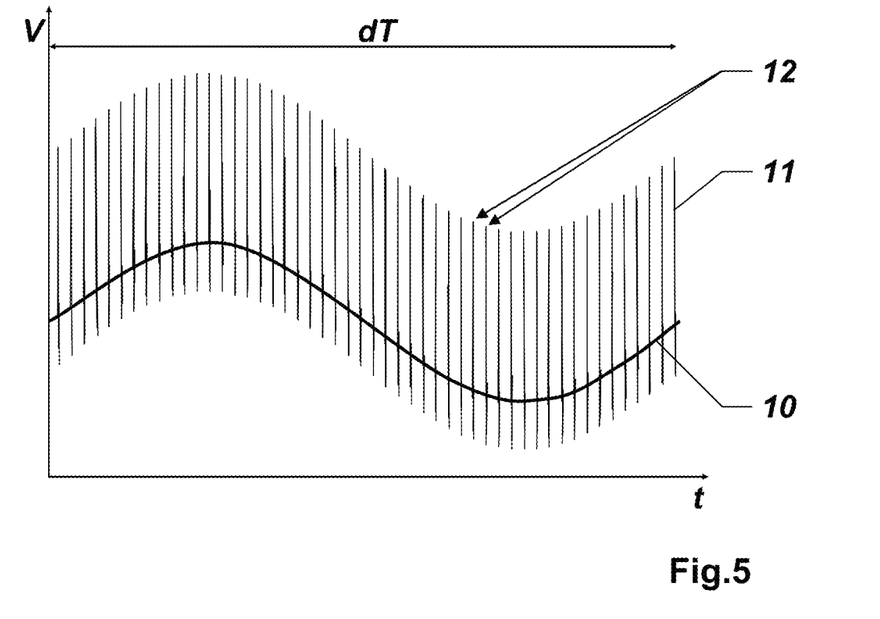
FIG. 5: shows an illustration of a compensation of the INL error by means of a superimposition of the measurement signal generated by the detected reception signals with a varying bias signal.

FIG. 5 illustrates the correction of the INL error (of the local curvature of the INL error curve 8, see FIG. 4) by means of a superimposition of the measurement signal generated by the detected reception signals with a varying bias signal 10.

The figure shows an ADC input signal series 11 (reception signal series) generated according to the invention as a function of time t, consisting of a superimposition of the actual measurement signal generated by a plurality of (pulsed) reception signals 12 ("single shots") of a reception signal series with the varying bias signal 10, here for example a low-frequency sinusoidal signal, wherein here the superimposed bias signal 10 is average-value-free over the time period dT occupied by the ADC input signal series.

The bias signal 10 can be in particular a low-frequency oscillation signal, for example a sinusoidal, sawtooth, stepped, triangular or trapezoidal signal, wherein the bias signal 10 can be generated for example by adding discrete DC values to the measurement signal actually generated, e.g. set by a digital-to-analog converter (DAC).

Figure 6:
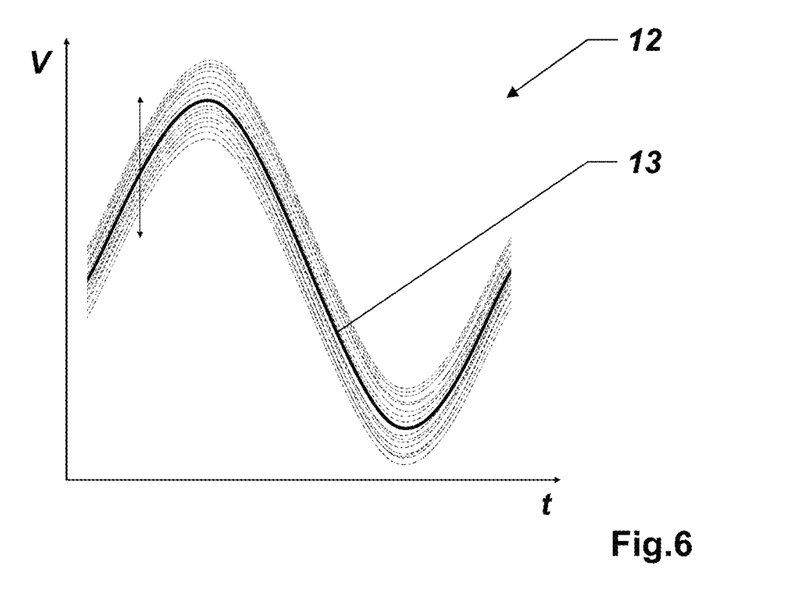
FIG. 6: shows an illustration of an averaging over a plurality of reception signals which were superimposed with a varying bias signal according to the invention for the generation of the ADC input signal.

FIG. 6 illustrates an averaging over a plurality of reception signals 12 ("single shots") of a reception signal series which was superimposed with a varying bias signal 10 (see FIG. 5) according to the invention for the generation of the ADC input signal series 11 (see FIG. 5).

As a result of the superimposition with the bias signal 10, the actual measurement signal of a reception signal 13 during the averaging, in one specific embodiment in an average-value-free manner, is shifted over a wide value range, as a result of which various error zones of the INL error curve 8 (see FIG. 4) are swept over. Averaging over a plurality of reception signals thus gives rise to an averaging over different INL error contributions, as a result of which the INL error influence is significantly reduced, in particular without any deterioration in the signal-to-noise ratio (SNR). A particularly efficient elimination of the INL influence on the signal waveform and thus on the distance measurement is achieved if the shot sequence frequency is effected asynchronously with respect to the sampling pattern and asynchronously with respect to the bias signal.

Figure 7:
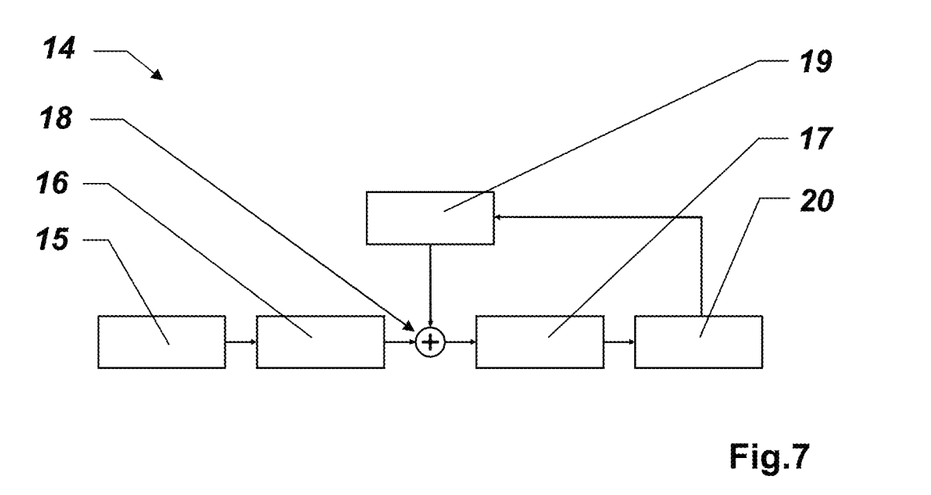
FIG. 7: shows an exemplary embodiment of a reception channel of a laser distance measuring module according to the invention.

FIG. 7 shows one exemplary embodiment of a reception channel 14 of a laser distance measuring module according to the invention comprising a receiving optical system and a receiving unit 15 for receiving transmission signals reflected at a target object as reception signals, installation electronics 16 for conditioning the reception signals into an analog electrical measurement signal, and also a (fast) analog-to-digital converter (ADC) 17, for example having an interleave architecture or a pipeline architecture.

The bias signal 10 (see FIG. 5) is superimposed 18 on the ADC input signal series, for example by adding discrete DC values to the measurement signal actually generated, e.g. set by a digital-to-analog converter (DAC) 19.

By virtue of the temporal variation of the INL error, for example in a temperature-dictated manner, by virtue of different requirements in respect of the measurement accuracy and by virtue of different reception strengths, if appropriate the amplitude of the varying bias signal 10 can be varied, e.g. by means of an FPGA or microprocessor 20 that records and processes the ADC signal.

It goes without saying that said figures illustrated only schematically illustrate possible exemplary embodiments. The various approaches can likewise be combined with one another and also with methods from the prior art.

What is claimed is:

1. A distance measuring method for determining a distance to a target object, the method comprising:
    emitting transmission signals as a transmission signal series;
    receiving at least portions of the transmission signals of the transmission signal series reflected at the target object as reception signals of a reception signal series;
    digitizing the reception signals of the reception signal series into digital signals of a digital signal series using an interleave or pipeline analog-to-digital converter, referred to hereinafter as ADC, and
    processing the digital signal series in order to derive the distance to the target object therefrom,
    wherein the reception signal series is superimposed with a bias signal that varies in a defined manner, wherein a value of the bias signal is varied over time in such a way that reception signals of the reception signal series are superimposed with different offset values within a defined value range.

2. The distance measuring method according to claim 1, wherein the different offset values are taken into account during the processing of the digital signal series in order to compensate for an average integral non-linearity of the ADC as a function of a signal value of an ADC input signal.

3. The distance measuring method according to claim 1, wherein the bias signal is configured as a signal having a low-frequency oscillation component.

4. The distance measuring method according to claim 1, wherein:
    the bias signal is generated by means of at least one of the following measures:
        adding different discrete DC values to an ADC input signal of an ADC input signal series generated by the reception signal series at different instants of the ADC input signal series referred to hereinafter as DAC,
        periodically shifting offset levels of a common-mode voltage of the ADC, and
        a noise generator for generating a variable additional signal to the ADC input signal series.

5. The distance measuring method according to claim 1, wherein the value range of the bias signal is set on the basis of:
    a defined measurement accuracy for the determination of the distance, or
    a measured signal value of a reception signal.

6. An electronic laser distance measuring module for determining a distance to a target object comprising:
    a transmission channel having a transmitting unit for generating transmission signals of a transmission signal series;
    a reception channel having a receiving unit for receiving at least portions of the transmission signals of the transmission signal series reflected at the target object as reception signals of a reception signal series;
    a reception circuit for digitizing the reception signals of the reception signal series into digital signals of a digital signal series with an interleave or pipeline analog-to-digital converter, referred to as ADC hereinafter; and a supervisory and control unit for determining the distance to the target object on the basis of a processing of the digital signal series, in particular summing or averaging the digital signals over the digital signal series, in particular wherein the determination of the distance is based on the pulse time-of-flight method, wherein the laser distance measuring module is configured in such a way that:
- a bias signal that varies in a defined manner is generated, and
- the reception signal series is superimposed with the bias signal, wherein a value of the bias signal is varied over time in such a way that reception signals of the reception signal series are superimposed with different offset values within a defined value range.

7. The laser distance measuring module according to claim 6, wherein the different offset values are taken into account during the processing of the digital signal series by the supervisory and control unit in order to compensate for an average integral nonlinearity of the ADC as a function of a signal value of an ADC input signal.

8. The laser distance measuring module according to claim 6, wherein the bias signal is configured as a signal having a low-frequency oscillation component.

9. The laser distance measuring module according to claim 6, wherein the bias signal is generated by means of at least one of the following measures:
- adding different discrete DC values to an ADC input signal of an ADC input signal series generated by the reception signal series at different instants of the ADC input signal series, referred to hereinafter as DAC,
- periodically shifting offset levels of a common-mode voltage of the ADC, and
- a noise generator for generating a variable additional signal to the ADC input signal series.

10. The laser distance measuring module according to claim 6, wherein the value range of the bias signal is set on the basis of:
- a defined measurement accuracy for the determination of the distance, or
- a measured signal value of a reception signal.

* * * * *